(12) United States Patent
Chao et al.

(10) Patent No.: US 7,476,871 B2
(45) Date of Patent: Jan. 13, 2009

(54) SPECIMEN BOX FOR ELECTRON MICROSCOPE CAPABLE OF OBSERVING GENERAL SPECIMEN AND LIVE CELL

(75) Inventors: Chih-Yu Chao, Taipei (TW); Wen-Jiunn Hsieh, Taipei County (TW)

(73) Assignee: Contrel Technology Co., Ltd., Tainan County (TW)

( * ) Notice: Subject to any disclaimer, the term of this patent is extended or adjusted under 35 U.S.C. 154(b) by 175 days.

(21) Appl. No.: 11/452,333

(22) Filed: Jun. 14, 2006

(65) Prior Publication Data
US 2007/0145287 A1    Jun. 28, 2007

(30) Foreign Application Priority Data
Dec. 9, 2005    (TW) .............................. 94143729 A

(51) Int. Cl.
G21K 5/10    (2006.01)
G21K 5/08    (2006.01)
G01N 23/04    (2006.01)

(52) U.S. Cl. .................. 250/440.11; 250/306; 250/307; 250/310; 250/311

(58) Field of Classification Search ............ 250/440.11, 250/306, 307, 309–311, 492.21, 492.2, 492.3
See application file for complete search history.

(56) References Cited

U.S. PATENT DOCUMENTS

| | | | | |
|---|---|---|---|---|
| 3,785,234 A * | 1/1974 | Sitte ............................. 83/414 |
| 3,924,126 A * | 12/1975 | Anderson et al. ............ 250/311 |
| 4,071,766 A * | 1/1978 | Kalman et al. ............ 250/443.1 |
| 4,720,633 A * | 1/1988 | Nelson ........................ 250/310 |
| 5,255,258 A * | 10/1993 | Kawade et al. ............... 369/126 |
| 5,752,425 A * | 5/1998 | Asakura et al. ............... 83/713 |
| 6,469,309 B1 * | 10/2002 | Kasai ..................... 250/442.11 |
| 6,891,159 B2 * | 5/2005 | Khursheed et al. .......... 250/310 |
| 7,253,418 B2 * | 8/2007 | Moses et al. ........... 250/440.11 |
| 7,304,313 B2 * | 12/2007 | Moses et al. ........... 250/440.11 |
| 7,388,211 B2 * | 6/2008 | Chao et al. .............. 250/441.11 |
| 2004/0084633 A1 * | 5/2004 | Moffatt .................... 250/492.2 |
| 2004/0135082 A1 * | 7/2004 | Inanobe et al. .............. 250/306 |
| 2004/0135083 A1 * | 7/2004 | Kakibayashi et al. ....... 250/307 |
| 2005/0092933 A1 * | 5/2005 | Moriya .................. 250/440.11 |
| 2005/0199825 A1 * | 9/2005 | Moffatt ................. 250/440.11 |
| 2006/0033038 A1 * | 2/2006 | Moses et al. ........... 250/440.11 |
| 2006/0038133 A1 * | 2/2006 | Moriya .................. 250/440.11 |
| 2006/0169916 A1 * | 8/2006 | Schneider .............. 250/440.11 |
| 2006/0261284 A1 * | 11/2006 | Chao et al. ............. 250/440.11 |

(Continued)

Primary Examiner—Bernard E Souw
(74) Attorney, Agent, or Firm—Bacon & Thomas, PLLC

(57) ABSTRACT

A specimen box for an electron microscope capable of observing a general specimen or a live cell is formed of a housing. The housing includes a receiving chamber formed therein and at least one view hole formed on each of a top side thereof and a bottom side thereof and communicating with the receiving chamber and coaxially aligned with the other. The distance between a bottom end of the view hole located on the top side of the housing and a top end of the view hole located on the bottom side of the housing is smaller than 50 µm. The housing is ultra-thin to enable penetration of the electron beam therethrough even though a liquid specimen is injected into the housing. A general specimen or a live cell can be put into the housing for the microscopic observation under the electron microscope.

15 Claims, 10 Drawing Sheets

U.S. PATENT DOCUMENTS

2007/0145287 A1* 6/2007 Chao et al. ............. 250/440.11
2007/0145288 A1* 6/2007 Chao et al. ............. 250/440.11
2007/0145289 A1* 6/2007 Chao et al. ............. 250/440.11

* cited by examiner

US 7,476,871 B2

SPECIMEN BOX FOR ELECTRON MICROSCOPE CAPABLE OF OBSERVING GENERAL SPECIMEN AND LIVE CELL

BACKGROUND OF THE INVENTION

1. Field of the Invention

The present invention relates generally to electron microscopes, and more particularly, to a specimen box for an electron microscope capable of observing a general specimen or a live cell.

2. Description of the Related Art

As known in prior art, while a conventional electron microscope is operated to observe an object, the object has to be a nonvolatile solid for further microscopic observation because of the limitation of the vacuum environment of the specimen chamber inside the electron microscope. If the object is volatile, such as liquid, gas, or other fluid, the object will generate a great amount of gas upon after being put into the vacuum specimen chamber, and thus, not only the electron beam of the electron microscope will fail to penetrate the object for successful imaging or experiment of electron diffraction, but also high-vacuum area, like electron beam gun, will lower its vacuum level or cause contamination therein, further damaging the microscope.

Limited to the vacuum environment, the conventional electron microscope could be operated for structural observation of solid substance inside the specimen chamber or for observation of dehydrated biological tissues only, like cells, viruses, and bacteria, neither for observation of any cell, virus or the like having physiological functions under the fluid environment, absolutely nor for observation of biochemical reaction processes, like transcription between deoxyribonucleic acid (DNA) and ribonucleic acid (RNA) inside the nucleus, translation between RNA and protein, microtubules inside the cytoplast, and of any vital biological phenomenon, like physiology of transduction at neuromuscular junctions.

Therefore, there must be a device that the live cell or tissue could be put therein and the device could be put into the electron microscope for observation.

Although some people proposed an observable environment inside the electron microscope, such as Gai P. L. (Gai P. L., Microscopy & Microanalysis 8, 21, 2002) whose research group exhibited an achievement that the gas, liquid, and solid chemical reactions could be observed under the electron microscope. However, such design has the following drawbacks. It failed to effectively control the thickness of the liquid and gas specimen layers, disabling penetration of the electron beam through the specimen and dramatically reducing the resolution of the microscope. Moreover, the massive volatilized vapor or the high-pressure gas injected into the gas chamber from outside will fill the space between upper and lower pole pieces of the microscope to cause very serious multiple electron scattering due to electrons impinging excessive gasiform molecules, further disabling successful imaging of the electron beam or experiment of electron diffraction.

In view of above, after successive trials and experiments, the present invention is finally invented to improve the aforementioned drawbacks of the prior art and to receive general specimens or live cells for observation under the microscope.

SUMMARY OF THE INVENTION

The primary objective of the present invention is to provide a specimen box for an electron microscope capable of observing a general specimen or a live cell, wherein the general specimen or the live cell can be put into the specimen box for the microscopic observation.

The secondary objective of the present invention is to provide a specimen box for an electron microscope capable of observing a general specimen or a live cell, wherein the specimen box is too ultra-thin to disable penetration of the electron beam therethrough even though a liquid is injected into the specimen box.

The foregoing objectives of the present invention are attained by the specimen box is formed of a housing. The housing includes a receiving chamber formed therein and at least one view hole formed on each of a top side thereof and a bottom side thereof and communicating with the receiving chamber and coaxially aligned with the other. The distance between a bottom end of the view hole located on the top side of the housing and a top end of the view hole located on the bottom side of the housing is smaller than 50 μm. The housing is too ultra-thin to disable penetration of the electron beam therethrough even though a liquid specimen is injected into the housing. A general specimen or a live cell can be put into the housing for the microscopic observation under the electron microscope.

DETAILED DESCRIPTION OF PREFERRED EMBODIMENTS

Figure 1:
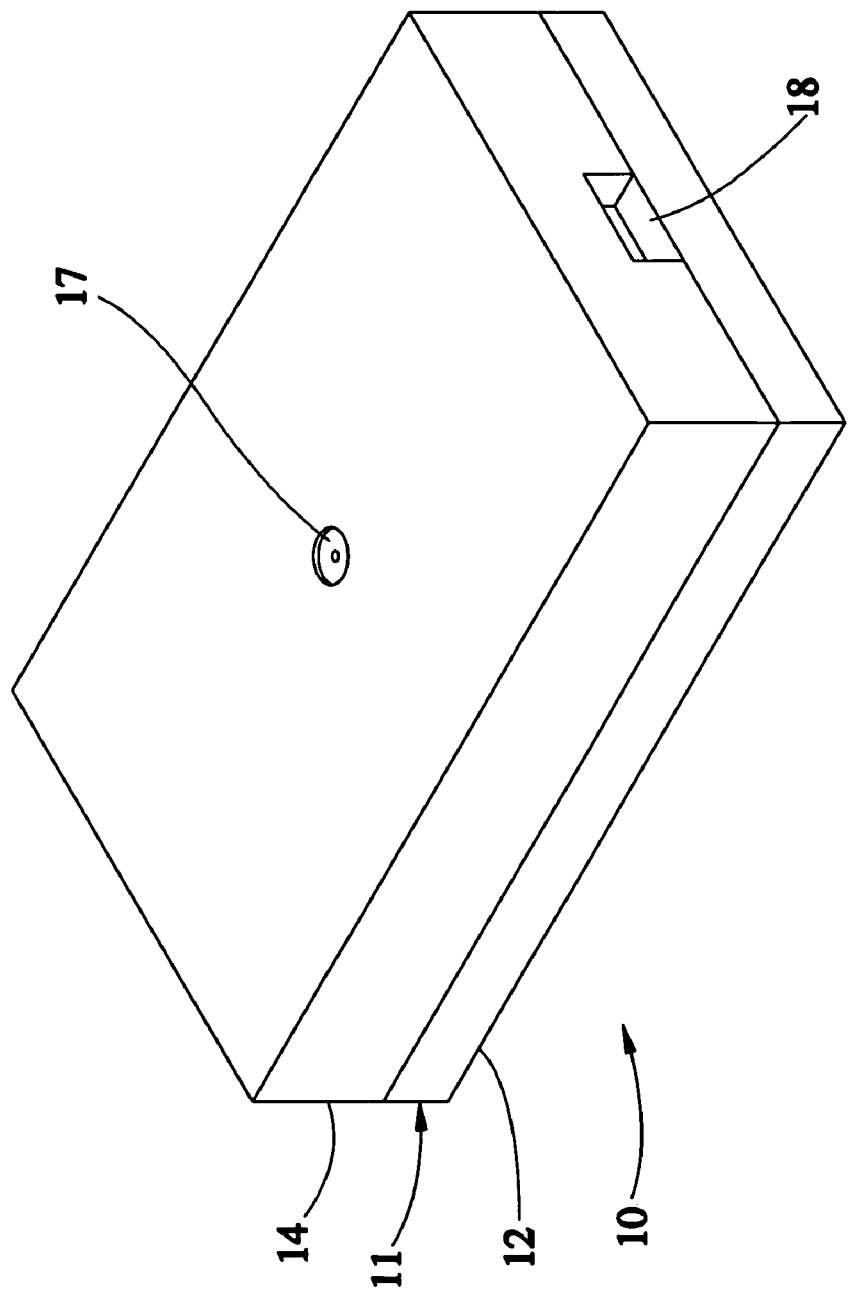
FIG. 1 is a perspective view of a first preferred embodiment of the present invention.
Figure 2:
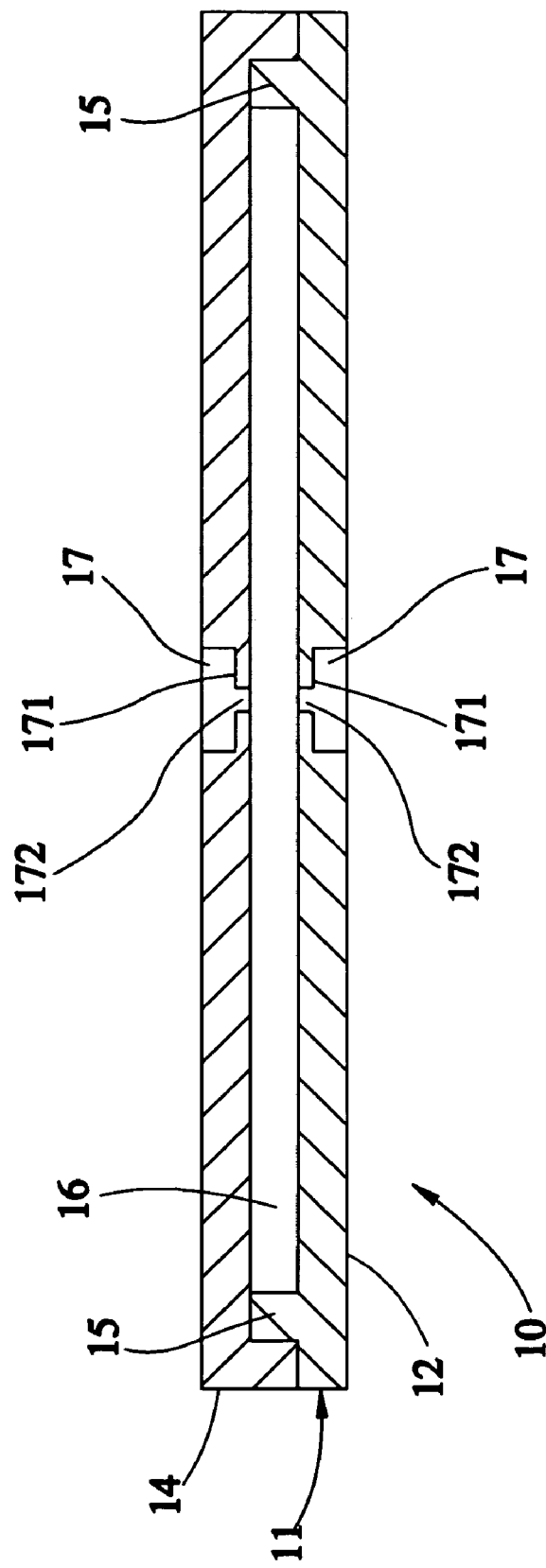
FIG. 2 is a sectional view of the first preferred embodiment of the present invention.

Referring to FIGS. 1-2, a specimen box 10 for an electron microscope capable of observing a general specimen or a live cell, according to a first preferred embodiment, is formed of a housing 11.

The housing 11 can be formed in one piece or in combination, including a base shell 12 and a cover shell 14 combined with the base shell 12 in this embodiment by means of two catches 15 formed on at bilateral sides of the housing 11 respectively. The housing 11 includes a receiving chamber 16 formed therein and at least one view hole 17 formed on each of a top side thereof and a bottom side thereof and communicating with the receiving chamber 16 and coaxially aligned with the other. Each of the view holes 17 has a diameter of 5-500 μm, wherein 50 μm is preferable. The distance between a bottom end of the view hole 17 located on the top side of the housing 11 and a top end of the view hole 17 located on the bottom side of the housing 11 is smaller than 50 µm. A thin annular piece 171 is formed at an end of each of the view holes 17, abutting the receiving chamber 16 and having a through hole 172. The through hole 172 is smaller than the view holes 17 in diameter. Hydrophobic or super-hydrophobic treatment is applied to the sidewall of each of the view holes 17 and outer surfaces of the annular piece 171 and the housing 11. For example, make a plurality of pillars, each of which has a diameter of within hundreds of nanometers, and then attach a self-assembly monomolecular layer to each of the surfaces of the pillars to enable the contact angle of a water drop on the surface to be larger than 150 degree or adopt other super-hydrophobic coating methods to achieve super-hydrophobia. Further, hydrophilic treatment is applied to the inner sidewall of the housing 11, an end surface of the annular piece 171 abutting the receiving chamber 16, and the sidewall of the through hole 172 to maintain the water inside the housing 11. After the hydrophobic or super-hydrophobic treatment is done, any redundant water injected into the housing 11 tends to be repelled by the hydrophobic sidewalls of the view holes 17 and the hydrophobic outer surface of the annular piece 171 and does not remain on the sidewalls of the view holes 17 and the outer surface of the annular piece 171. In this embodiment, the housing 11 is made by microlithography including photo exposure process and etching process, or laser micromachining or mechanical micromachining. The housing 11 includes an inlet 18 formed at one side thereof.

Figure 3:
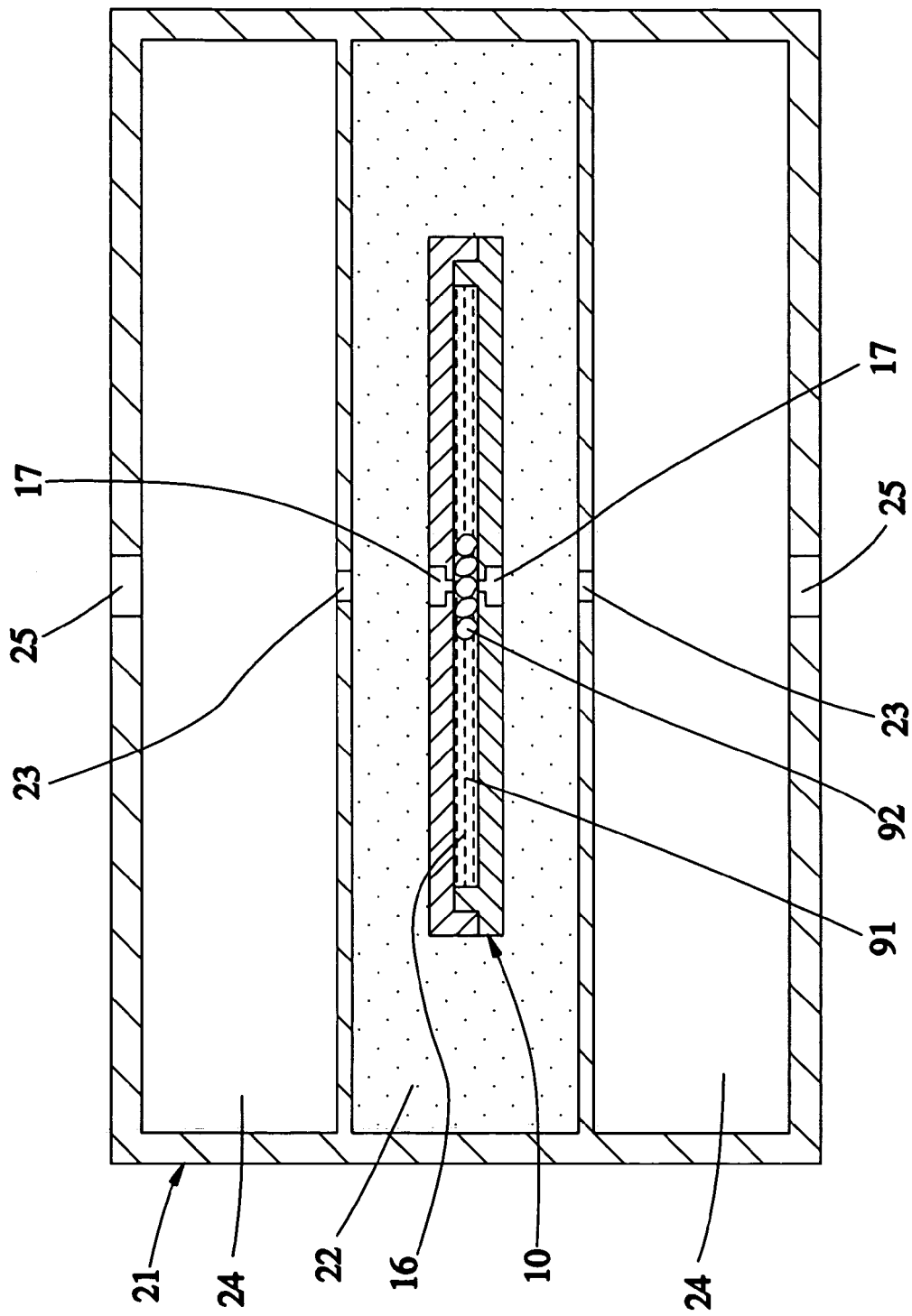
FIG. 3 is a schematic view of the first preferred embodiment of the present invention in operation.

While the specimen box 10 is in use and then a specimen having a liquid 91 and live cells 92 are put into the specimen box 10, the liquid 91 and the live cells 92 can be injected through the inlet 18 into the specimen box 10; alternatively, an adequate amount of the liquid 91 and the live cells 92 can be dropped onto the base shell 12 of the receiving chamber 16 and then cover the base shell 12 with the cover shell 14 and combine them together with an adhesive. The specimen box 10 can be mounted in an observational container 21 mounted in an electron microscope (not shown). As shown in FIG. 3, the observational container 21 has a gas chamber 22, two buffer chambers 24 formed above and below the gas chamber 22 respectively, two gas apertures 23 formed at a top side and a bottom side of the gas chamber 22 respectively, and two outer apertures 25 formed at a top end thereof and a bottom end thereof respectively. The specimen box 10 is located in the gas chamber 22. The outer apertures are coaxially aligned with the gas apertures 23 and the view holes 17.

In operation, supply the gas chamber 22 with vapor of predetermined pressure, such as an admixture of saturated (or unsaturated) water vapor and a specific gas, wherein the specific gas can be nitrogen, oxygen, carbon dioxide, and an inert gas, and the water vapor inside the gas chamber 22 can refrain the evaporation of the water inside the receiving chamber 16. In addition, supply the gas chamber 22 with a specific gas of one atmospheric pressure and keep the difference between the pressure of the specific gas and the pressure of the water solution in the specimen box 10 be smaller than or equal to the critical pressure (Keller S. et al., Journal of Food Protection 66, 1260, 2003) that the water solution leaks out of the receiving chamber 16, thus preventing the water solution in the receiving chamber 16 from flowing out of the view holes 17, wherein the water solution volatilizes slowly into the buffer chamber 24. Keep pumping out the buffer chambers 24 to pump away the vapor and the gas exhausting through the gas apertures 23 from the gas chamber 22 and then into the two buffer chambers 24 and thus to prevent them from entry into the electron microscope (not shown) from the observational container 21. For observation of the specimen inside the specimen box 10, enable the electron beam of the electron microscope to pass through the outer and gas apertures 25 and 23 and the view holes 17.

Figure 4:
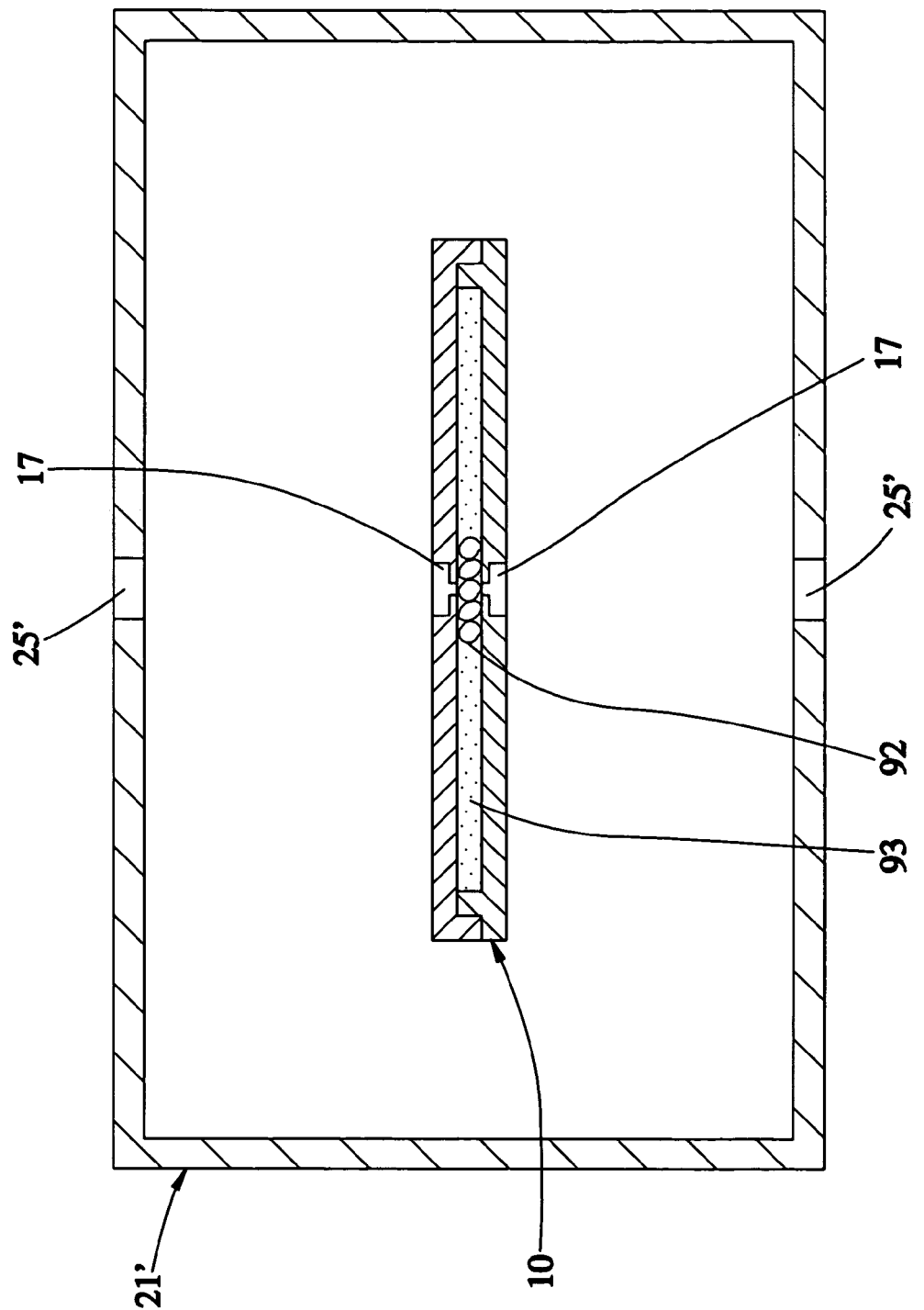
FIG. 4 is another schematic view of the first preferred embodiment of the present invention in operation.

Referring to FIG. 4, while the specimen box 10 is put therein with the live-cell specimen 92 and is injected therein with an admixture 93 of the water vapor of a predetermined pressure (e.g. saturated water vapor of one atmospheric pressure) and a specific gas (e.g. nitrogen, oxygen, carbon dioxide, and an inert gas), the specimen box 10 can be mounted in another observational container 21' mounted in the electron microscope (not shown). The observational container 21' encloses the specimen box 10, having two outer apertures 25' formed on a top end thereof and a bottom end thereof. The outer apertures 25' are coaxially aligned with the view holes 17. The microscale of the view hole 17 can limit the gas or the liquid inside the specimen box 10 to slowly volatilize into the observational container 21' to further maintain the vaporous environment inside the specimen box 10; meanwhile, the gas or the liquid exhausted outward can keep being replaced by supplemental one through the inlet 18 because of little amount. Further, pump out the observational container 21' to prevent the admixture 93 from leaking out of the observational container 21' and from entry into the electron microscope (not shown).

The distance (smaller than 50 µm) between the two coaxially aligned view holes 17 is crucial to the present invention because it keeps the liquid inside the specimen box 10 thin other than too thick to ensure the electron beam to pass through the liquid for imaging and it maintains the water vapor or the liquid inside the specimen box 10 to enable the live-cell specimen to be put into the specimen box 10 for the microscopic observation. In other words, the present invention enables observation of live cells or live bacteria or live viruses in addition to nonliving cells or other general specimens.

Figure 5A:
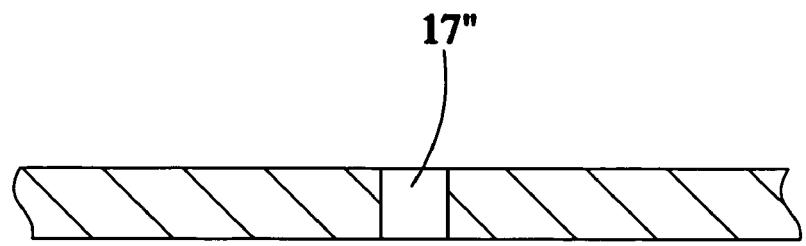
FIGS. 5(A)-5(C) each are sectional view, illustrating different shapes of the view hole according to the first preferred embodiment of the present invention.
Figure 5B:
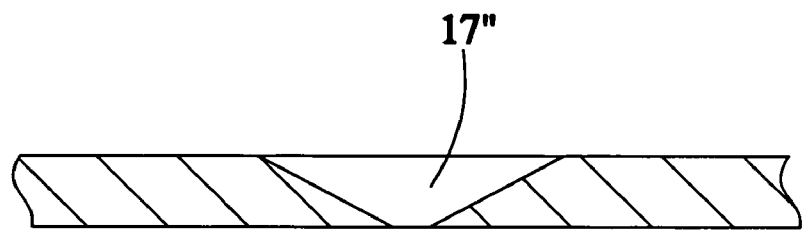
Figure 5C:
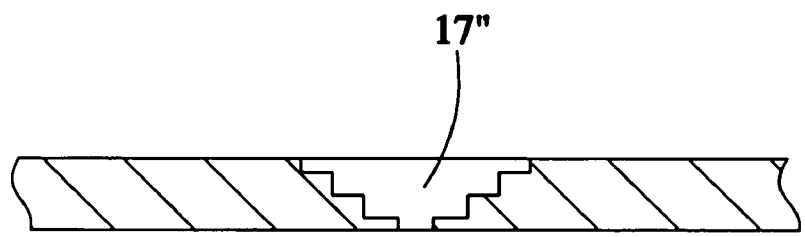

In addition, the cross section of each of the view holes 17 is not limited to the shape indicated in the aforementioned embodiment. For example, FIG. 5(A) illustrates that the view hole 17' is cylindrical; FIG. 5(B) illustrates that the view hole 17" is taper-shaped; and FIG. 5(C) illustrates that the view hole 17''' is annularly stepped.

Figure 6:
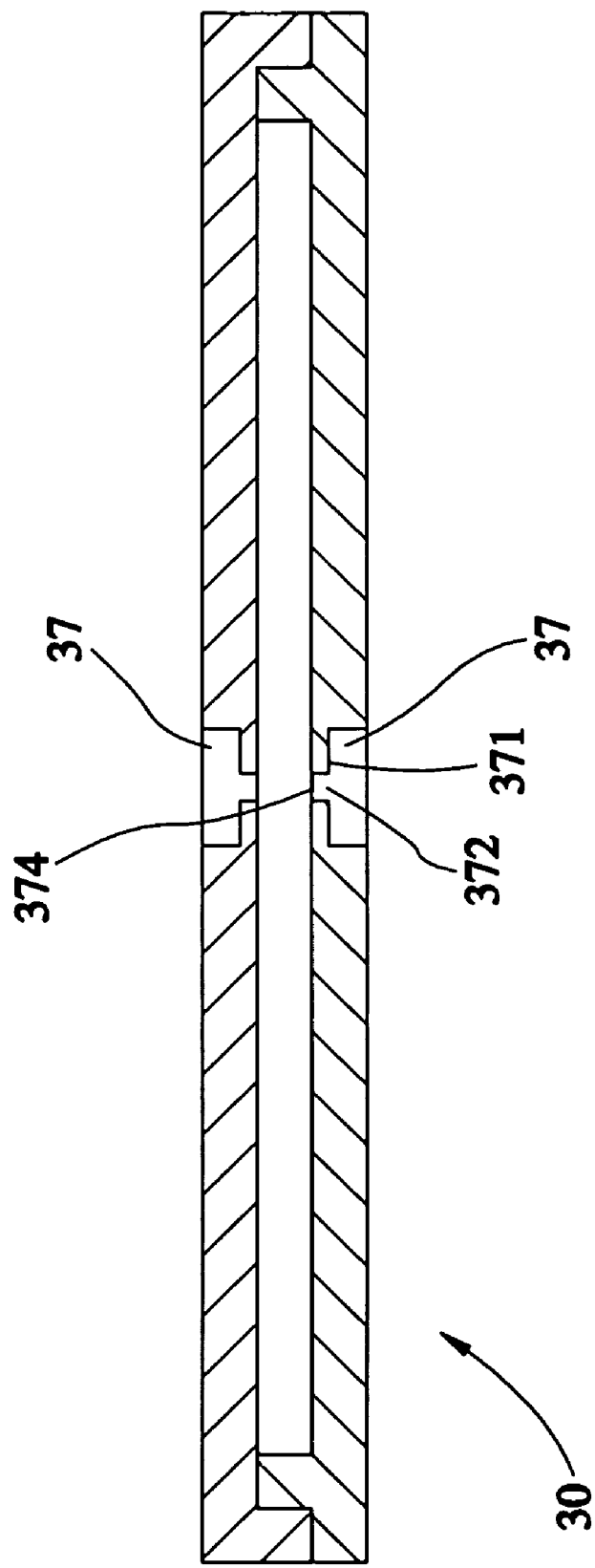
FIG. 6 is a sectional view of a second preferred embodiment of the present invention.

Referring to FIG. 6, a specimen box 30 for an electron microscope capable of observing a general specimen or a live cell, according to a second preferred embodiment, is similar to the first embodiment but different as recited below.

An amorphous film 374, such as an amorphous carbon film, is mounted to and seals the through hole 372 of the annular piece 371 of one of the view holes 37 of the specimen box 30. The film 374 is very thin, about 50-100 nm in thickness, thus preventing the incident electron beam from multiple electron scattering and diffuse scattering. While the specimen box 30 is mounted in the observational container 21 or 21' indicated in the first embodiment, the liquid and the gas under the same conditions can be put into the specimen box 30 and the same operation can be applied to the specimen box 30 as the first embodiment.

Figure 7:
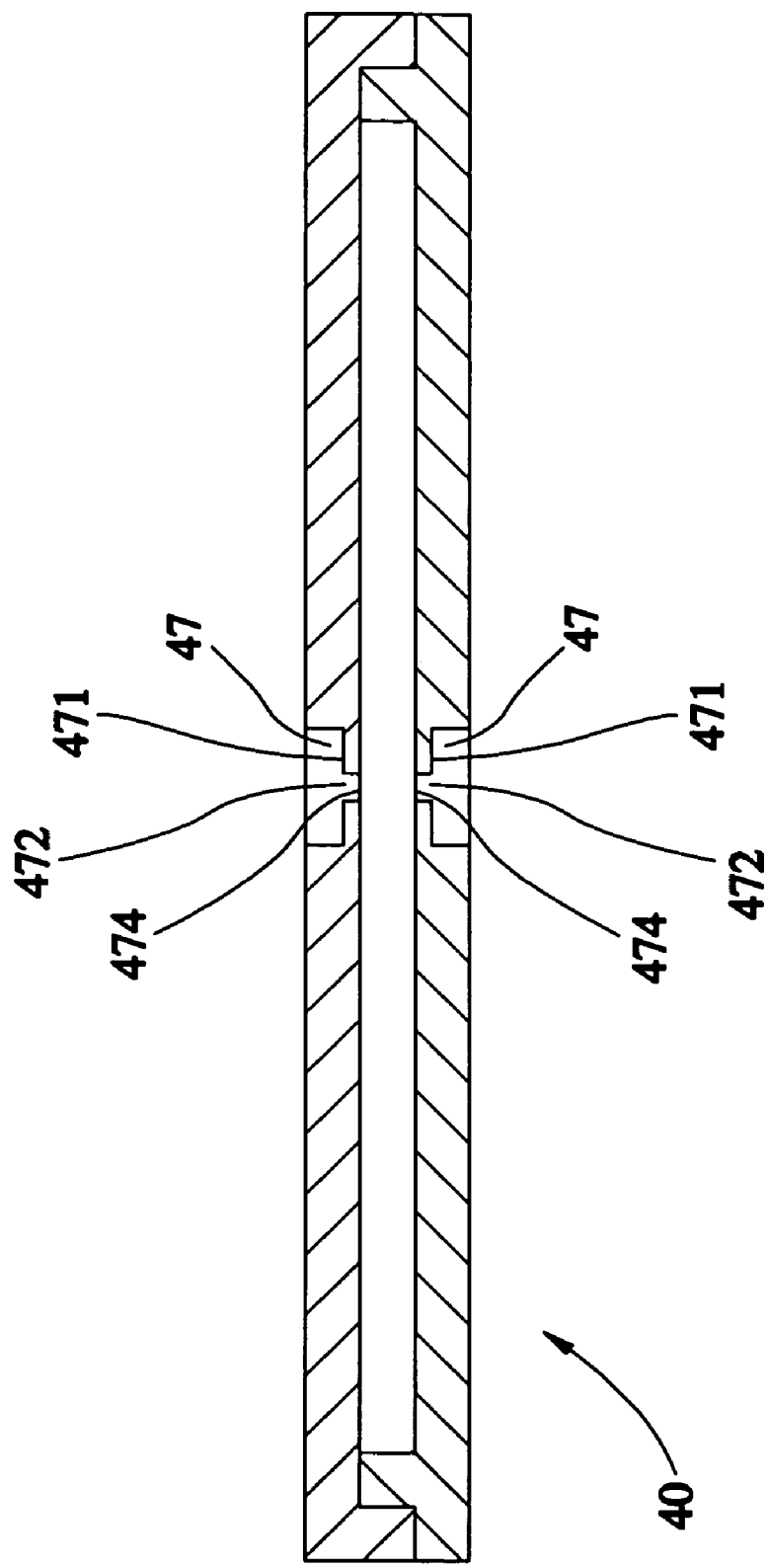
FIG. 7 is a sectional view of a third preferred embodiment of the present invention.

Referring to FIG. 7, a specimen box 40 for an electron microscope capable of observing a general specimen or a live cell, according to a third preferred embodiment, is similar to the first embodiment but different as recited below.

An amorphous film 474, such as amorphous carbon film, is mounted to and seals each of the through holes 472 of the annular pieces 471 of the two view holes 47 of the specimen box 40. Each of the films 474 is very thin, about 50-100 nm in thickness, thus preventing the incident electron beam from multiple electron scattering and diffuse scattering. In operation, the specimen box 40 can be directly mounted in the electron microscope (not shown) for observation. The films 474 can maintain the liquid or the gas in the specimen box 40. Alternatively, the specimen box 40 can be mounted in an observational container (not shown) of the electron microscope (not shown). The observational container has gas and buffer chambers for depressurizing the specimen box 40 as the same potency as the first embodiment, and thus no further recitation is necessary. Moreover, the gas and buffer chambers of the observational container can reduce the difference between the pressures located at two sides of the film 474, such that the film 474 can be made thinner and the electron beam can be less affected.

Figure 8:
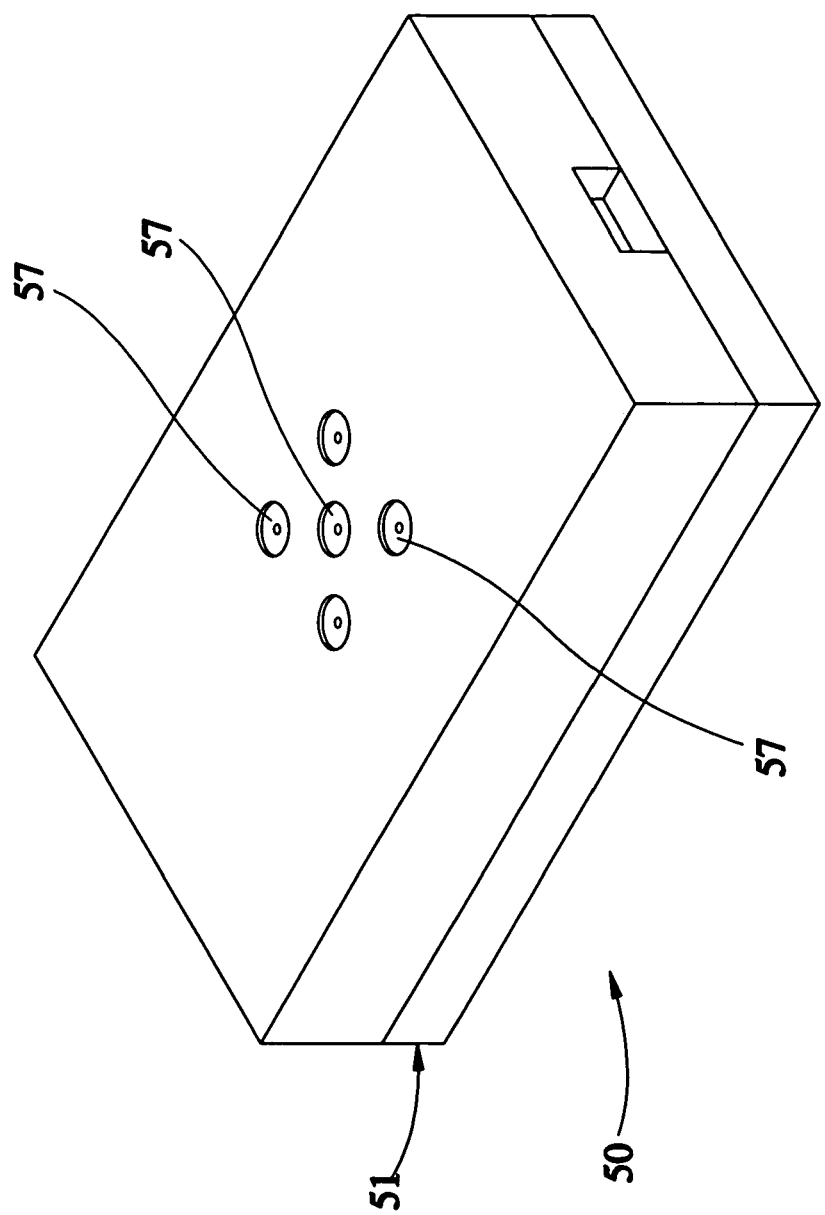
FIG. 8 is a perspective view of a fourth preferred embodiment of the present invention.

Referring to FIG. 8, a specimen box 50 for an electron microscope capable of observing a general specimen or a live cell, according to a fourth preferred embodiment, is similar to the first embodiment but different as recited below.

The housing 51 of the specimen box 50 includes numerous pairs of the view holes 57 formed on top and bottom sides thereof for more observational positions, wherein each pair of the view holes 57 is coaxially aligned. The operation of the fourth embodiment is the same as that of the first embodiment, and thus no more description is necessary.

Figure 9:
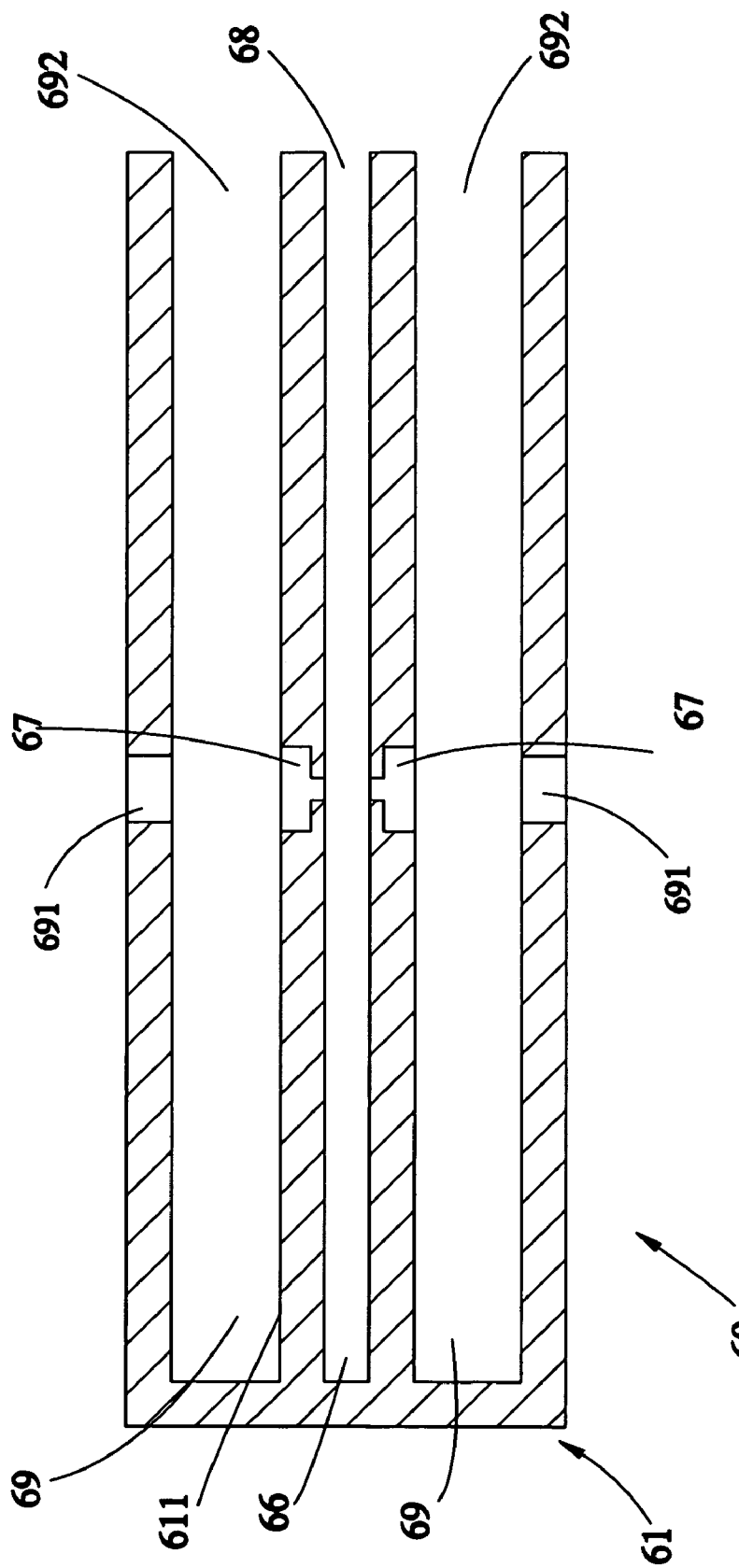
FIG. 9 is a sectional view of a fifth preferred embodiment of the present invention.

Referring to FIG. 9, a specimen box 60 for an electron microscope capable of observing a general specimen or a live cell, according to a fifth preferred embodiment is formed of a housing 61.

The housing 61 is made by microlithography and can be formed in one piece or in combination. The housing 61 includes at least one spacer 611 formed therein for partitioning an inner space thereof into a receiving chamber 66 and at least one ultra-thin gas chamber 69. At least one view hole 67 is formed at each of top and bottom sides of the receiving chamber 66 and located on the spacer 611, communicating with the receiving chamber 66 and coaxially aligned with the other. The distance between a bottom end of the view hole 67 located at the top side of the receiving chamber 66 and a top end of the other view hole 67 is smaller than 50 μm. The gas chamber 69 encloses the view holes 67. At least one gas aperture 691 is formed at each of top and bottom sides of the gas chamber 69 and coaxially aligned with the view holes 67. The distance between an end of the gas aperture 691 located close to the gas chamber 69 and an end of the view hole located closest to the gas aperture 691 and close to the gas chamber 69 is defined 5-5000 μm. The housing 61 further includes an inlet 68 formed at one side of the receiving chamber 66, and a gas inlet 692 formed at one side of said gas chamber 69.

Figure 10:
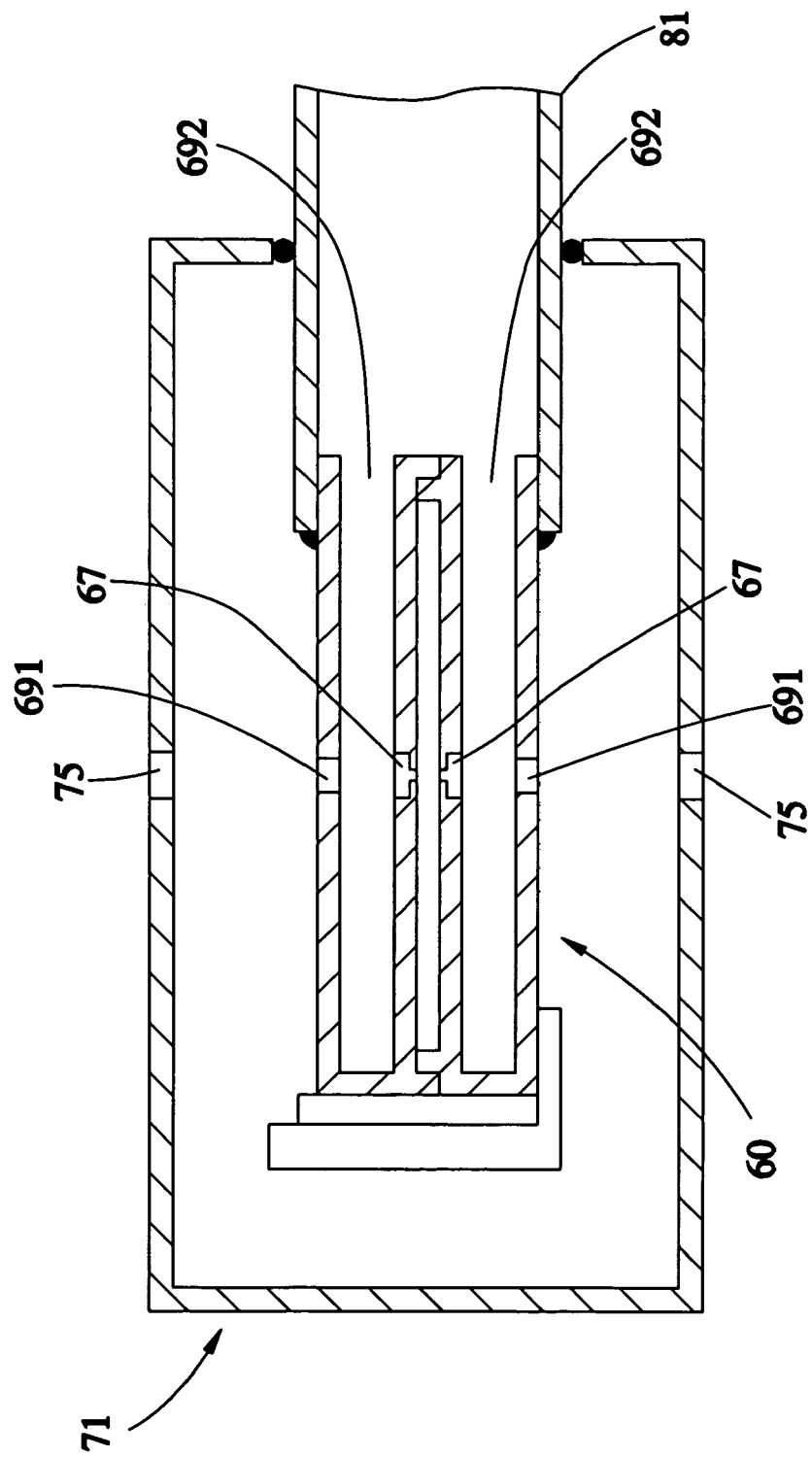
FIG. 10 is a sectional view of the fifth preferred embodiment of the present invention in operation.

In operation, the specimen box 60 can be mounted in an observational container 71 of an electron microscope (not shown) and a holder 81 is mounted in the observational container 71 for cooperation with the specimen box 60, as shown in FIG. 10. The observational container 71 encloses the specimen box 60, having an outer aperture 75 formed at each of a top side thereof and a bottom side thereof. The outer apertures 75 are coaxially aligned with the gas apertures 691 and the view holes 67. The gas chamber 69 can be injected therein with water vapor or an admixture of the water vapor and a specific gas through the holder 81 and the gas inlets 692. The rest of operation is the same as the first embodiment such that further description is not necessary.

Further, an amorphous film (not shown) is mounted to each of the through holes of the view holes 67 of the receiving chamber 66 in the housing 61 by the manner indicated in the aforementioned third embodiment. The amorphous film can be mounted only to the through hole of the view hole located at the top side or the bottom side of the receiving chamber 66. Because the operation is the same as the aforementioned embodiment, no further recitation is necessary.

In each of the aforementioned embodiments, the specimen box can receive the live-cell specimen (FIG. 4) which can be fixed to an inner sidewall or inner top and bottom sides thereof by means of a cell attachment agent, like poly-D-lysine, coated on the inner sidewall of the specimen box, or on the films mounted to the view holes shown in FIGS. 6 and 7. Further, the specimen box can be acted as a small petri dish for culturing the live-cell specimen therein being analyzed. Further, a nutrient fluid and other fluid matters being analyzed can be injected through the inlet 18 and then exhaust through an outlet (not shown) to enable circulation of the nutrient fluid and the fluid matters inside the receiving chamber 66(16). For the embodiments that the view hole 37 is sealed with the film 374 at one end thereof only, as shown in FIG. 6, and the view hole 17 is not sealed with any film, as shown in FIG. 2, while the live-cell specimen 92 and the nutrient fluid or a liquid specimen being observed are injected through the inlet 18, in operation, supply a specific gas of predetermined pressure for the gas chambers of the observational container and keep the difference between the pressure of the specific gas and the pressure of the liquid inside the receiving chamber being smaller than or equal to the critical pressure (Keller S. et al., Journal of Food Protection 66, 1260, 2003) that the liquid solution leaks out of the receiving chamber, thus enabling the circulation of the injected nutrient fluid or the liquid specimen inside the receiving chamber without its flowing out of the view holes. In addition, it is alternative to pump out or inject the water through the inlet 18 to control the amount and the pressure of the liquid specimen 91 inside the receiving chamber 16(66).

In conclusion, the present invention includes advantages as follows:

1. The present invention can be placed therein with a general specimen or a live cell therein for the microscopic observation under the electron microscope. The operation can be done according to the above-mentioned embodiments.
2. The present invention can effectively keep the constant thickness of the liquid specimen. Further, the receiving chamber containing the liquid specimen and the gas chamber containing the vapor and the gas made by microlithography are both ultra-thin, thus preventing the electron beam from multiple electron scattering further influencing the observational resolution.

Although the present invention has been described with respect to a specific preferred embodiment thereof, it is no way limited to the details of the illustrated structures but changes and modifications may be made within the scope of the appended claims.

What is claimed is:

1. A specimen box for an electron microscope capable of observing a general specimen or a live cell, comprising a housing, said housing having a receiving chamber formed therein, at least one view hole formed at each of a top side thereof and a bottom side thereof, said view holes communicating with said receiving chamber and being coaxially aligned, wherein a distance between a bottom end of said view hole located on the top side of said housing and a top end of said view hole located on the bottom side of said housing is smaller than 50 μm.

2. The specimen box as defined in claim 1, wherein each of said view holes has a diameter of 5-500 μm.

3. The specimen box as defined in claim 2, wherein said housing includes a base shell and a cover shell.

4. The specimen box as defined in claim 3, wherein said cover and base shells are connected by at least one catch.

5. The specimen box as defined in claim 3, wherein at least one of said view holes is sealed with a film.

6. The specimen box as defined in claim 3, wherein each of said view holes comprises a thin annular piece formed at an end abutting said receiving chamber, said annular piece having a through hole which diameter is smaller than that of said view hole.

7. The specimen box as defined in claim 6, wherein said annular piece is applied thereto by hydrophilic treatment at an end surface thereof abutting said receiving chamber, said through hole is applied thereto by hydrophilic treatment at a sidewall thereof.

8. The specimen box as defined in claim 3, wherein each of said view holes is cylindrical or taper-shaped or annularly stepped.

9. The specimen box as defined in claim 3, wherein each of said view holes is applied thereto by hydrophobic or super-hydrophobic treatment at a sidewall thereof.

10. The specimen box as defined in claim 3, wherein said housing is applied thereto by hydrophilic treatment at a sidewall thereof.

11. The specimen box as defined in claim 3, wherein said housing is made by microlithography or laser micromachining or mechanical micromachining.

12. The specimen box as defined in claim 3, wherein said housing comprises an inlet formed at one side thereof.

13. A specimen box for an electron microscope capable of observing a general specimen or a live cell, comprising a housing, said housing having at least one spacer formed therein for partitioning an inner space thereof into a receiving chamber and at least one gas chamber, at least one view hole formed at each of a top side and a bottom side of said receiving chamber, and at least one gas aperture formed at a top side and a bottom side of said gas chamber, each of said view holes communicating with said receiving chamber and coaxially aligned with the other, wherein a distance between a bottom end of said view hole located at the top side of said receiving chamber and a top end of said view hole located at the bottom side of said receiving chamber is smaller than 50 μm, said gas chamber encloses at least one of said view holes, and said gas apertures and said view holes are coaxially aligned.

14. The specimen box as defined in claim 13, wherein a distance between an end of said gas aperture located close to said gas chamber and an end of said view hole located closest to said gas aperture and close to said gas chamber is defined 5-5000 μm.

15. The specimen box as defined in claim 13, wherein said housing comprises an inlet and a gas inlet formed at one side said receiving chamber and at one side of said gas chamber respectively.

* * * * *